US009492995B2

(12) United States Patent
Hwang et al.

(10) Patent No.: US 9,492,995 B2
(45) Date of Patent: Nov. 15, 2016

(54) ROLL PRINTING MACHINE AND METHOD OF ROLL PRINTING USING SAME

(71) Applicant: LG CHEM, LTD., Seoul (KR)

(72) Inventors: Ji Young Hwang, Daejeon (KR); In-Seok Hwang, Daejeon (KR); Jeseob Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 47 days.

(21) Appl. No.: 14/427,903

(22) PCT Filed: Nov. 6, 2013

(86) PCT No.: PCT/KR2013/010013
§ 371 (c)(1),
(2) Date: Mar. 12, 2015

(87) PCT Pub. No.: WO2014/073852
PCT Pub. Date: May 15, 2014

(65) Prior Publication Data
US 2015/0246523 A1    Sep. 3, 2015

(30) Foreign Application Priority Data

Nov. 6, 2012  (KR) .................. 10-2012-0125068
Nov. 6, 2012  (KR) .................. 10-2012-0125071

(51) Int. Cl.
  *B32B 3/00*   (2006.01)
  *B41F 3/00*   (2006.01)
  *B41F 3/36*   (2006.01)
(52) U.S. Cl.
  CPC . *B41F 3/00* (2013.01); *B41F 3/36* (2013.01); *Y10T 428/24802* (2015.01)

(58) Field of Classification Search
  CPC .............. B41F 3/00; B41F 3/34; B41F 3/36; B41F 16/00; B41F 17/00; B41M 1/10; H05K 2203/0143; Y10T 428/2482
  See application file for complete search history.

(56) References Cited

U.S. PATENT DOCUMENTS 5,272,974 A  * 12/1993 Guarino .................. B41F 13/44
                                                    101/181
2007/0119324 A1    5/2007 Yoo et al.
2007/0184743 A1 *  8/2007 Nordlinder ............. B32B 38/10
                                                    442/376

(Continued)

FOREIGN PATENT DOCUMENTS

JP       11320814 A    11/1999
KR    20030025994 A     3/2003

(Continued)

OTHER PUBLICATIONS

Taiwanese Office Action with English translation dated Nov. 5, 2015 in Taiwanese Patent Application No. 102140412 (14 pages total).

*Primary Examiner* — Elizabeth Mulvaney
(74) *Attorney, Agent, or Firm* — Dentons US LLP

(57) ABSTRACT

The present application relates to a roll printing apparatus and a roll printing method using the same, and the roll printing apparatus according to the present application comprises a printing roll support, a printing roll, a blanket which is provided on an outer surface of the printing roll, a coater which coats a surface of the blanket with ink, a cliche, and a printing object, in which the printing roll is provided to be fixed to the printing roll support so as to perform rotational motion, and the cliche is conveyed by the rotational motion of the printing roll.

20 Claims, 18 Drawing Sheets

(56) References Cited

U.S. PATENT DOCUMENTS

| | | | |
|---|---|---|---|
| 2010/0050889 A1* | 3/2010 | Manzini | B41F 5/24 101/141 |
| 2013/0329210 A1 | 12/2013 | Hwang et al. | |
| 2015/0132477 A1* | 5/2015 | Seong | B41C 1/00 427/146 |
| 2015/0173199 A1* | 6/2015 | Seong | B41F 35/00 427/98.4 |

FOREIGN PATENT DOCUMENTS

| KR | 20070055852 A | 5/2007 |
|---|---|---|
| KR | 20090027233 A | 3/2009 |
| KR | 20120014707 A | 2/2012 |
| KR | 20120097345 A | 9/2012 |
| KR | 20100002068 A | 10/2012 |
| KR | 20090003883 A | 11/2012 |

\* cited by examiner

[Process of Coating Printing Roll with Ink]

[Process of Transferring ink to Cliche]

[Process of Printing Ink onto Substrate]

[Process of Returning Printing Roll]

[In case in which set process is
performed on roll film]

[In case in which set process is performed on
film mounted on stage]

<Microscope picture of cliche>

<Microcope picture of printed matter>

[Possibility of transmission of HF when CrOx is not present]

[Possibility of double passivation of HF when CrOx is present]

ROLL PRINTING MACHINE AND METHOD OF ROLL PRINTING USING SAME

TECHNICAL FIELD

This application is a National Stage Entry of International Application No. PCT/KR2013/010013, filed Nov. 6, 2013 and claims the benefit of Korean Application Nos. 10-2012-0125068 and 10-2012-0125071 each filed on Nov. 6, 2012, all of which are hereby incorporated by reference in their entirety for all purposes as if fully set forth herein.

The present application relates to a roll printing apparatus and a roll printing method using the same. More particularly, the present application relates to a roll printing apparatus and a roll printing method using the same, which may perform continuous roll printing, thereby reducing a tack time, and improving productivity.

BACKGROUND ART

In general, minute patterns, which are used in semiconductor circuit elements and display devices such as an LCD and a PDP, are formed by photolithography using a photoresist, and generally manufactured by performing a coating step, an exposure step, a developing step, a cleaning step, and a curing step.

However, even though the photolithography has an advantage in that desired and precise patterns may be obtained, the photolithography has drawbacks in that a number of processes need to be performed, numerous types of materials need to be used to maximize the effect of the photoresist, and a large amount of photoresist is consumed in a process such as a coating process.

In recent years, in order to resolve the drawbacks of the photolithography, researches and developments are conducted on a technology that is suggested to obtain minute patterns using a roll printing manner.

The roll printing apparatus for forming patterns may be applied to various manners such as offset printing, reverse offset printing, and roll-to-roll printing, and may be applied to a wide field to transfer patterns such as patterns for forming electrode of a thin film transistor (TFT) or a plasma display panel (PDP), and patterns of barrier rib materials as well as R (Red), G (Green), B (Blue) colors, which are constituent elements of a color filter, and black matrix (BM) patterns.

The roll printing apparatus generally comprises a coater, a printing roll, a printing roll drive device, a cliche, or a drive device for alignment of a substrate stage and a stage as mostly basic constituent elements, and may additionally comprise a cliche and/or piping cleaning device, a drying device for drying a blanket by absorbing solvent absorbed in the blanket, and various types of sensors.

Precision of the pattern formed by the roll printing manner and pattern transfer efficiency greatly depend on process conditions such as a coating state from the coater to the roll or the blanket of the roll, an amount of volatilized solvent and a standby time until the pattern is transferred to the cliche or the substrate after a coating process, and printing pressure that is formed by a gap between the stage and the roll or the blanket while the pattern is transferred.

Particularly, by the coating state at the time of coating the roll or the blanket, which is a first step of the roll printing process, whether stains having various shapes are formed or not as well as uniformity of the entire patterns are determined.

In general, according to the roll printing apparatus as described above, there is a drawback in that the a tack time is inevitably required until a printing process is performed by preparing the printing roll again and coating the printing roll after one printing process is performed using the printing roll.

Here, the tack time means the time taken until a subsequent glass substrate is loaded after one product is unloaded, the tack time is set by adjusting the number of other apparatuses on the basis of the time taken until the glass substrate is unloaded from photolithography equipment after the glass substrate is loaded in the photolithography equipment when the liquid crystal display (LCD) is manufactured, and even in the case of the printing roll, the tack time similarly means the time taken when one printing roll is moved in and out. In the case of the roll printing, there is a limit in that a production speed is relatively low because of the tack time in comparison with the photolithography equipment.

DETAILED DESCRIPTION OF THE INVENTION

Technical Problem

The present application provides a roll printing apparatus and a roll printing method using the same, which may improve a tack time and productivity by continuously performing roll printing.

Technical Solution

The present application provides a roll printing apparatus comprising a printing roll support, a printing roll, a blanket which is provided on an outer surface of the printing roll, a coater which coats a surface of the blanket with ink, a cliche, and a printing object, in which the printing roll is provided to be fixed to the printing roll support so as to perform rotational motion, and the cliche is conveyed by the rotational motion of the printing roll.

In addition, the present application provides a roll printing method comprising: 1) preparing a printing roll which is provided to be fixed to a printing roll support so as to perform rotational motion, a blanket which is provided on an outer surface of the printing roll, a coater which coats a surface of the blanket with ink, a cliche, an idle roll which is provided at a lower end of the cliche, and a printing object; 2) allowing the printing roll to perform the rotational motion and coating the surface of the blanket with the ink; 3) transferring the ink to the cliche while synchronizing a movement speed of the cliche by the rotational motion of the printing roll having the blanket coated with the ink; and 4) printing the ink, which is not transferred to the cliche and exists on the blanket, onto the printing object.

In addition, the present application provides a printed matter printed using the roll printing apparatus.

In addition, the present application provides a touch panel comprising the printed matter.

Advantageous Effects

According to the present application, the cliche may be conveyed by the rotational motion of the printing roll, and the movement speed of the cliche may be synchronized by the rotational motion of the printing roll. Therefore, the roll printing apparatus and the roll printing method according to the present application may continuously perform roll printing, and may reduce a tack time, thereby greatly improving productivity. In addition, the printing object on which printing is completed and the printing object to be subsequently printed may be efficiently replaced, thereby improving productivity.

EXPLANATION OF REFERENCE NUMERALS AND SYMBOLS

Figure 1:
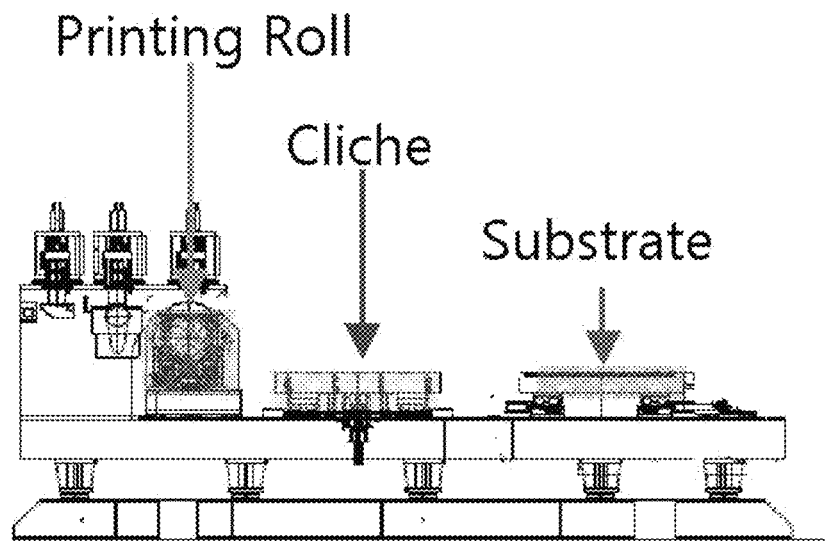
FIGS. 1 to 4 are views schematically illustrating a roll printing apparatus and a roll printing method according to an exemplary embodiment in the related art.
Figure 1:
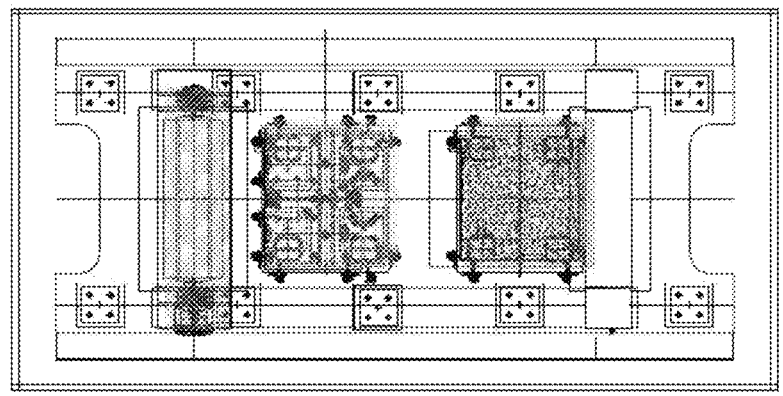
Figure 2:
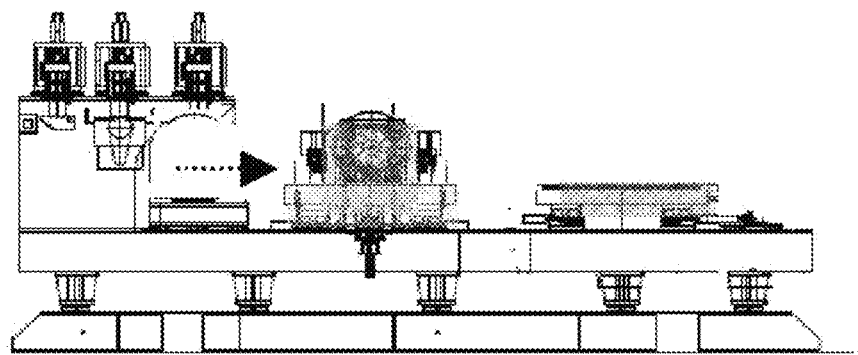
Figure 2:
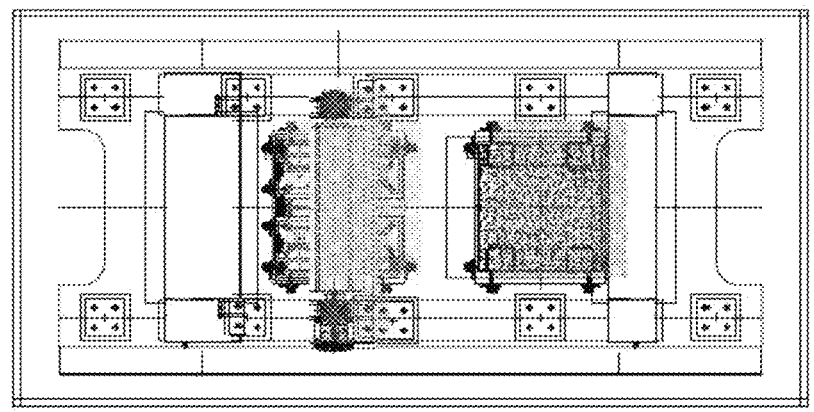
Figure 3:
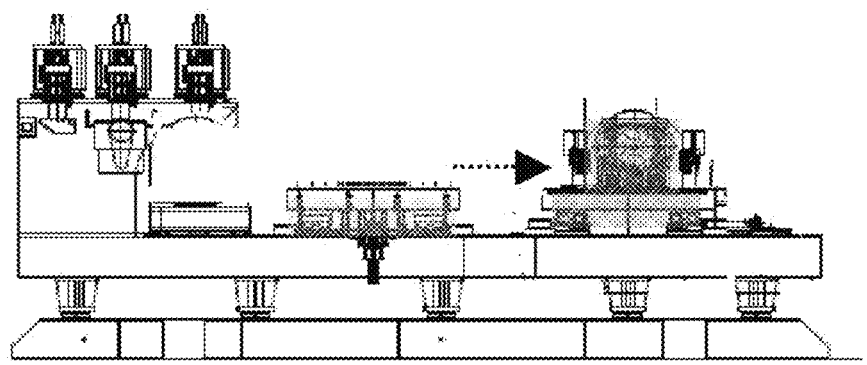
Figure 3:
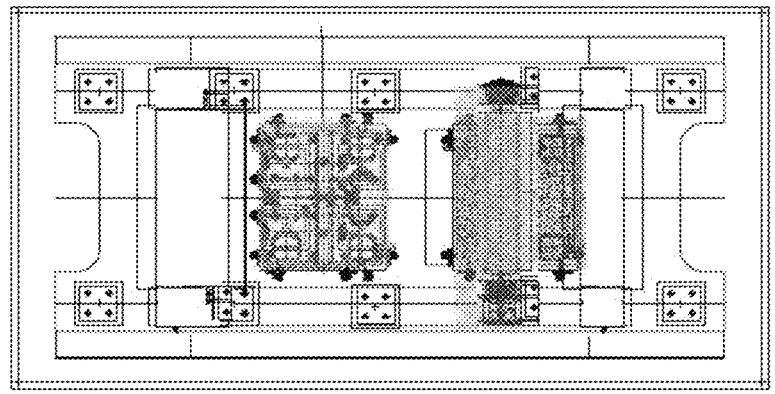
Figure 4:
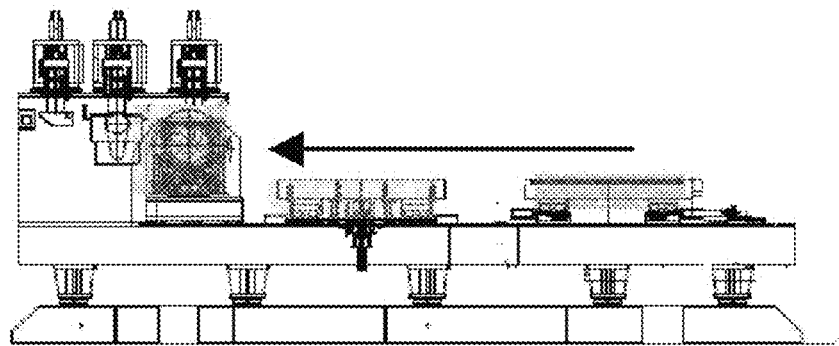
Figure 4:
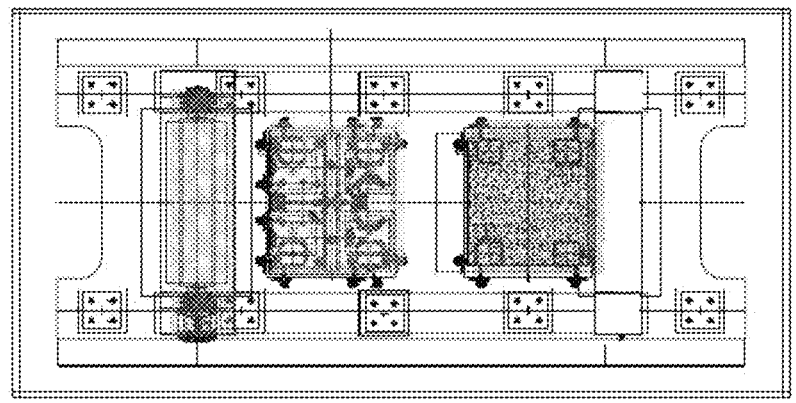

60: Stationary roll
70: Freely rotating roll
80: Porous sheet
90: Vacuum hole forming region of stationary roll
100: Vacuum hole forming region of freely rotating roll
110: Blanket
120: Film substrate

BEST MODE

Hereinafter, the present application will be specifically described.

A general roll printing apparatus in the related art basically comprises a coater, a printing roll, a printing roll drive device, a cliche stage, and a substrate stage. A blanket is wound on the printing roll, and a cliche and a substrate are placed on the cliche stage and the substrate stage, respectively. The printing roll may be formed in a cylindrical shape, and the blanket is provided on an outer surface of the printing roll. The blanket may be made of rubber that has an adhesive property with ink, and elasticity.

The printing roll may be provided to reciprocate relative to the cliche and the substrate such that the printing roll receives a pattern from the cliche, and retransfers the pattern to the substrate.

The cliche stage and the substrate stage may be installed on a lower frame, and the cliche stage and the substrate stage are installed detachably from the lower frame, thereby applying the cliche having various patterns in accordance with various target patterns.

The printing roll is driven by a drive device such as a printing roll drive motor, and rotates and moves (reciprocating motion) above the lower frame, and in this case, the blanket provided on the outer surface of the printing roll comes into contact with upper surfaces of the cliche and the substrate while the printing roll rotates, such that a pattern is transferred from the cliche to the substrate.

That is, as illustrated in the following FIGS. 1 to 4, the roll printing apparatus in the related art has a process flow in which after a process of coating the blanket of the printing roll with ink, a process (an off process) of transferring the ink to the cliche and a process (a set process) of printing the ink on the substrate are performed through movement and up and down motion of the printing roll, and the printing roll returns back to an ink coating position after a printing process is completed. However, the process flow somewhat has disadvantages to process performance from the viewpoint that unit processes need to be independently separated in terms of the fact that the movement of the printing roll, which is the main component for printing, needs to be accompanied, and the printing roll needs to return back to an initial standby position after the printing process is completed.

Figure 5:
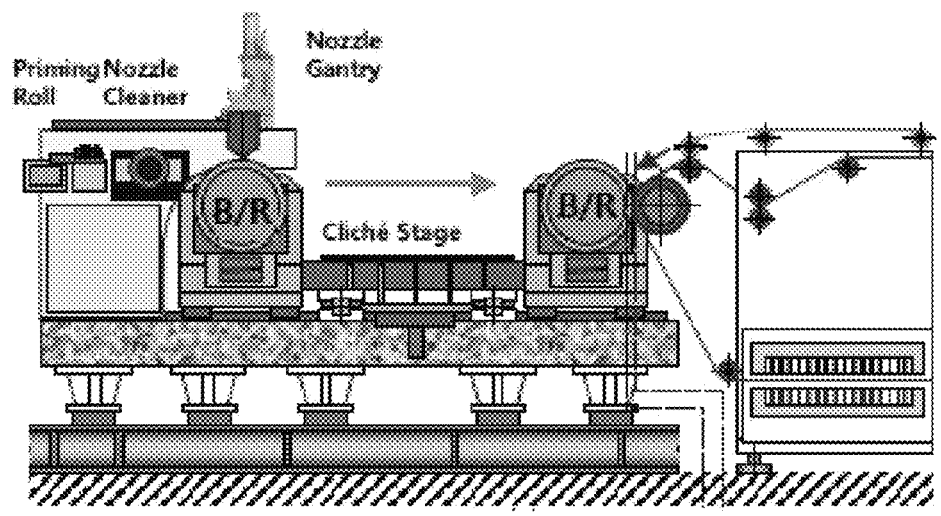
FIGS. 5 and 6 are views schematically illustrating a roll printing apparatus and a roll printing method according to an exemplary embodiment in the related art.
Figure 6:
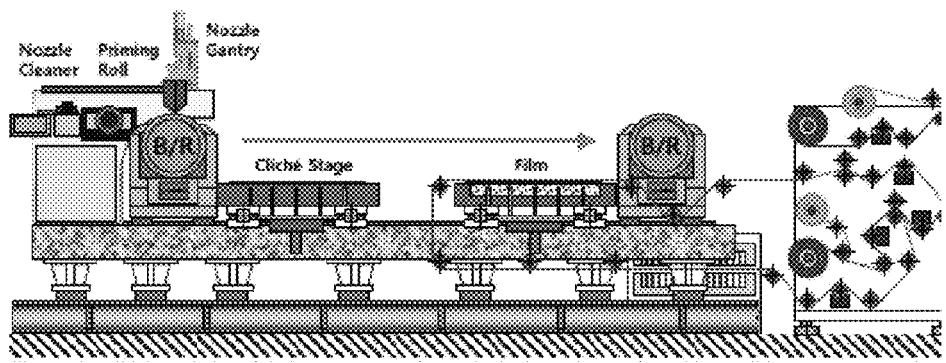

In addition, as illustrated in the following FIGS. 5 and 6, the roll printing apparatus in the related art has the same problem in that the movement of the printing roll needs to be accompanied even in a case in which a printing process is performed on a flexible film.

Therefore, in order to resolve the aforementioned problems in the related art, the core of resolving the problems may be a development of a process for minimizing the movement of the printing roll that is a main component for printing.

A roll printing apparatus according to the present application comprises a printing roll support, a printing roll, a blanket which is provided on an outer surface of the printing roll, a coater which coats a surface of the blanket with ink, a cliche, and a printing object, in which the printing roll is provided to be fixed to the printing roll support so as to perform rotational motion, and the cliche is conveyed by the rotational motion of the printing roll.

According to the present application, a movement speed of the cliche may be synchronized by the rotational motion of the printing roll. As described above, the movement speed of the cliche may be automatically synchronized by the rotational motion of the printing roll, and as a result, there is no need for a control device or the like for synchronizing the cliche.

In addition, the roll printing apparatus may additionally comprise an idle roll, and the idle roll may be provided at a lower end of the cliche.

According to the present application, the idle roll refers to a roll which is not supplied with power and may autonomously rotate without using power. That is, the idle roll refers to a roll which may be rotated when any power is transmitted to the roll, and does not rotate when power is not transmitted to the roll. The idle roll may rotate because bearings are attached to both sides of the idle roll, and a steel roll, a rubber roll, a plastic roll, or the like may be used suitably for a location where the idle roll is used.

A plurality of idle rolls may be provided, and may freely rotate by an operation of the cliche.

According to the present application, the idle roll may be formed in the form of a conveyor belt. In this case, a guide roll and the like may be additionally provided in order to prevent the cliche from being damaged and lifted up when off and set processes are performed by the printing roll.

The idle roll may be made of a material that is known in the corresponding technical field. More specifically, the idle roll may be made of rubber, steel, or the like, but the material thereof is not limited thereto.

In addition, a separate means for driving the idle roll may be provided, or may not be provided.

According to the present application, the cliche may be loaded onto the idle roll so as to come into contact with a lower portion of the printing roll so that the movement speed of the cliche may be synchronized by the rotational motion of the printing roll.

According to the present application, the printing object may be a flat plate-shaped substrate, and the flat plate-shaped substrate may be provided on the idle roll. The flat plate-shaped substrate may be a glass, a plastic film, or the like, but is not limited thereto.

According to the present application, the roll printing apparatus additionally comprises a roll-shaped supporting unit that supports the printing object, and the printing object may be a film substrate. The film substrate may be a plastic film or the like, but is not limited thereto.

The roll printing apparatus may additionally comprise a printing object providing unit which continuously provides the film substrate, and a printing object collecting unit which continuously collects the film substrate. In this case, the roll-shaped supporting unit may be provided between the printing object providing unit and the printing object collecting unit, and the film substrate may be provided on the roll-shaped supporting unit.

According to the present application, a material or a thickness of the film substrate is not particularly limited, as long as the film substrate may be continuously provided by operations of the printing object providing unit and the printing object collecting unit, and a printed matter pattern, which is intended to be printed, may be transferred to the film substrate.

According to the present application, the printing object providing unit and the printing object collecting unit may continuously provide the film substrate so that the film substrate is moved in one direction. According to the present application, the printing object providing unit may be an unwinder, and the printing object collecting unit may be a rewinder. Hereinafter, the printing object providing unit is exemplified as the unwinder, and the printing object collecting unit is exemplified as the rewinder, but the configuration is not particularly limited as long as the configuration may continuously provide the film substrate.

As necessary, operations of the unwinder and the rewinder may be intermittently controlled. Therefore, according to the present application, intermittently continuous printing is possible. In the present specification, the term intermittently continuous printing may be understood as a process in which while the operations of the unwinder and the rewinder are intermittently controlled at a necessary step during a printing process, the film substrate mounted on the unwinder and the rewinder is continuously provided onto the roll-shaped supporting unit so that a printing pattern is transferred to the film substrate. In order to perform the aforementioned intermittently continuous printing, the roll printing apparatus may further comprise a control unit that intermittently controls the operations of the unwinder and the rewinder.

The roll printing apparatus according to the present application may further comprise a position control unit that controls positions of the film substrate and the rewinder so that the film substrate is wound on a suitable position of the rewinder when the film substrate is wound on the rewinder. The position control unit may be an electronic position controller (EPC).

The roll printing apparatus according to the present application may additionally comprise a control unit that stops the operations of the unwinder and the rewinder when a printing target region of the film substrate is positioned on the roll-shaped supporting unit, and restarts the operations of the unwinder and the rewinder after a process of transferring the printed matter pattern is completed.

In a case in which tension is applied to the film substrate, the roll printing apparatus according to the present application is advantageous when a precise pattern is printed on the film substrate. For example, it is preferable that tension of 1 Kgf/m (film width) or more, 3 Kgf/m (film width) or more, or 5 to 10 Kgf/m (film width) or more is applied to the film substrate. The tension may be applied by adjusting the operations of the unwinder and the film substrate rewinder, or by a nipping unit that will be described below. In this regard, the roll printing apparatus according to the present application may additionally comprise a tension control unit that controls the tension of the film substrate.

The roll printing apparatus according to the present application may additionally comprise a drive motor that moves the roll-shaped supporting unit upward and downward in a direction of the printing roll while rotating the roll-shaped supporting unit.

According to the present application, a nipping unit, which blocks tension from being applied to the film substrate, may be further comprised between the unwinder and the printing object supporting unit, between the rewinder and the roll-shaped supporting unit, or both between the unwinder and the roll-shaped supporting unit and between the rewinder and the roll-shaped supporting unit.

The nipping unit is fixed to the roll-shaped supporting unit such that the nipping unit may be moved together with the roll-shaped supporting unit when the roll-shaped supporting unit is aligned. The nipping unit may be moved together with the roll-shaped supporting unit in up and down directions.

According to the present application, since the film substrate is continuously provided by the unwinder and the rewinder as described above, a position of the film substrate needs to be adjusted so that a pattern may be printed on an accurate position during the printing process, and in this case, in order to adjust the position of the film substrate, the tension applied to the film needs to be blocked. According to the present application, the tension applied to the film substrate may be blocked by the nipping unit. In addition, the nipping unit may also serve to apply a predetermined amount or more of tension to the film substrate.

It is preferable that the nipping unit fixes the film substrate while the printed matter pattern is transferred onto the film substrate on the roll-shaped supporting unit, and is moved so as not to hinder the movement of the film substrate when the unwinder and the rewinder are operated. To this end, a control unit for controlling the nipping unit may be further comprised.

The nipping unit may be moved downward so that the movement route of the printing roll is not hindered, or vacuum suction is efficiently performed by a vacuum suction unit of the roll-shaped supporting unit during the printing process. In addition, the nipping unit may be moved upward so that a scratch is not formed on a lower surface of the film substrate. Therefore, the roll printing apparatus according to the present application may comprise a drive unit for moving the nipping unit upward and downward.

In order not to hinder the movement route of the printing roll, or in order to prevent a scratch from being formed on the lower surface of the film substrate, the roll-shaped supporting unit may be moved upward or downward.

An auxiliary fixing unit may be further comprised so as to stably provide a printing film to the nipping unit. It is preferable that the auxiliary fixing unit is provided between the unwinder and the nipping unit.

The roll printing apparatus according to the present application may further comprise a position control unit of the roll-shaped supporting unit so as to align the printing object. The position control unit of the roll-shaped supporting unit may be provided to be connected with the roll-shaped supporting unit. The position control unit of the roll-shaped supporting unit may align the roll-shaped supporting unit, before the printed matter pattern is transferred to the film substrate, so that the printed matter pattern is transferred to a suitable position on the film substrate by the printing roll. In addition, as described above, the film substrate may be moved upward and downward by the position control unit of the roll-shaped supporting unit, and thereby, a scratch may be prevented from being formed on the lower surface of the film substrate.

The roll printing apparatus according to the present application may further comprise a drying or curing unit that is provided between the roll-shaped supporting unit and the rewinder. The drying or curing unit may dry or cure the printed matter pattern transferred onto the film substrate. The drying or curing unit may comprise a control means so as to dry or cure the printed matter pattern under an appropriate condition. According to the present application, since the printing object may have the form of a film, it is preferable that a drying or curing temperature is adjusted depending on a film material.

The roll printing apparatus according to the present application may further comprise a second unwinder which is provided between the roll-shaped supporting unit and the rewinder, and provides a film which is intended to be laminated with the film substrate. A type of film, which is provided from the second unwinder, is not particularly limited, as long as the film can be laminated with the film substrate. For the lamination, a laminating means may be further comprised before the film substrate and the film provided from the second unwinder are wound on the rewinder. For example, a pressing means may be further comprised. The pressing means may be provided as a structure having two rolls. Two films may be laminated by the aforementioned pressing means.

A driving speed of the roll-shaped supporting unit may be synchronized with a driving speed of the printing roll that transfers the printed matter pattern. In other words, it is preferable that a linear speed at which the roll-shaped supporting unit is operated, and a linear speed at which the printing roll is operated are matched. As such, a precise pattern may be transferred. In this case, when the driving speed of the printing roll is calculated, it is preferable that the driving speed is calculated on the basis of the entire printing roll comprising the blanket.

A pressure between the roll-shaped supporting unit and the printing roll may be adjusted such that a precise pattern may be transferred.

According to the roll printing apparatus according to the present application, the roll-shaped supporting unit may be an idle roll. In this case, the rotational speed of the roll-shaped supporting unit may be synchronized by the rotational motion of the printing roll.

In addition, the roll-shaped supporting unit may comprise a stationary roll, a freely rotating roll provided on an outer surface of the stationary roll, and a porous sheet provided on an outer surface of the freely rotating roll. In the roll-shaped supporting unit, vacuum holes may be formed in a region of the stationary roll having an angle corresponding to a region with which the film substrate and the printing roll come into contact. Here, the angle may be 0.1° to 180° on the basis of a rotation axis of a roll-shaped printing film supporting unit, but is not limited thereto. In addition, vacuum holes may be formed in the entire region of the freely rotating roll.

The vacuum holes of the stationary roll and the freely rotating roll may be formed by vertically punching holes, and a vacuum may be formed only when the vacuum hole of the stationary roll and the vacuum hole of the freely rotating roll meet together.

Figure 13:
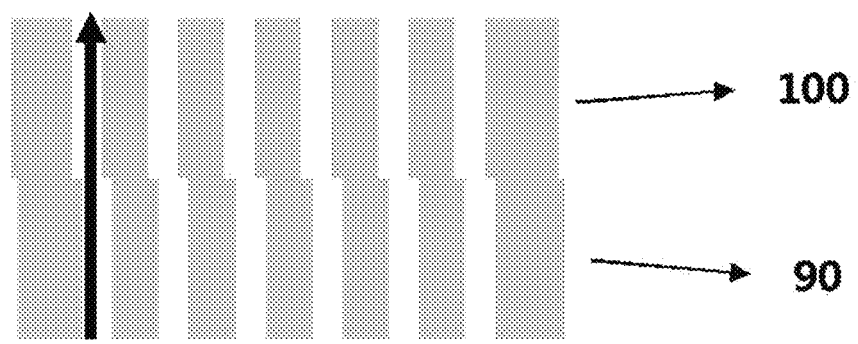
FIG. 13 is a view schematically illustrating a method of forming a vacuum in the printing object supporting unit of the roll printing apparatus according to the exemplary embodiment of the present application.

The following FIG. 13 schematically illustrates a state in which a vacuum is formed in the roll-shaped printing film supporting unit when the vacuum hole of the stationary roll and the vacuum hole of the freely rotating roll meet together, as described above.

That is, in the roll printing apparatus according to the present application, the vacuum hole is formed in only the region of the stationary roll corresponding to the region with which the film substrate and the printing roll come into contact, such that when a vacuum is formed at the entire roll-shaped supporting unit, the vacuum may be formed at only the region with which the film substrate and the printing roll come into contact, and the vacuum may not be formed at a region with which the film substrate and the printing roll do not come into contact. Accordingly, it is possible to prevent a defect of the pattern transfer due to the lifting up of the film substrate at the time of a pattern transfer process by the blanket of the printing roll, which is made of polydimethylsiloxane (PDMS).

Figure 12:
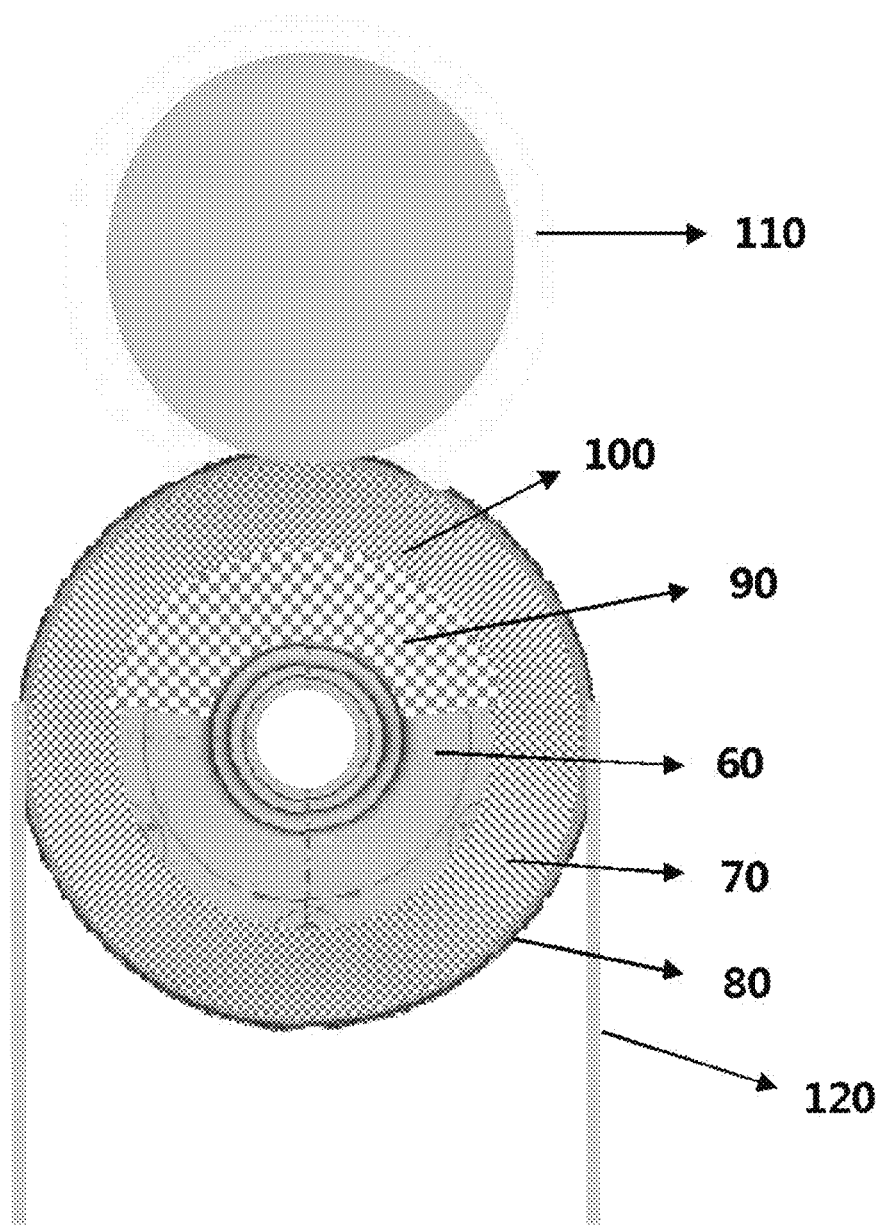
FIG. 12 is a view schematically illustrating a printing roll and a printing object supporting unit of the roll printing apparatus according to the exemplary embodiment of the present application.

The following FIG. 12 illustrates the exemplary embodiment of the roll-shaped supporting unit that comprises the stationary roll, the freely rotating roll, and the porous sheet, as described above.

In the roll printing apparatus according to the present application, a slit coater or a roll coater may be used as the coater, but the coater is not limited thereto.

The printing roll may be manufactured using stainless steel for precise machining, which has a surface that is processed by electrolytic polishing. As a specific example, the printing roll may be manufactured using SUS304 stainless steel, SUS305 stainless steel, or SUS316 stainless steel that has a surface processed by electrolytic polishing. When the surface of the stainless steel is processed using a metallic element such as nickel, corrosion and oxidation of the stainless steel may be prevented.

The printing roll may comprise a single roll, and may have a form in which the blanket is wound on two or more rolls.

In addition, the roll printing apparatus according to the present application may additionally comprise a drive device that allows the printing roll support or the printing roll to perform up and down motion or left and right rectilinear motion.

In the roll printing apparatus according to the present application, because the contents of ink composition and the like are the same as those known in the corresponding technical field, a specific description thereof will be omitted.

The roll printing apparatus according to the present application may be applied to the reverse offset printing.

The roll printing apparatus according to the present application may be used in various fields such as a process of manufacturing a color filter pattern, a semiconductor and a conductor, or a thin film transistor (TFT) substrate that constitutes gate-gate insulating film-active-passivation-pixel using an insulating material film.

In addition, the present application provides a roll printing method that uses the roll printing apparatus.

In addition, the roll printing method according to the present application comprises 1) preparing a printing roll which is provided to be fixed to a printing roll support so as to perform rotational motion, a blanket which is provided on an outer surface of the printing roll, a coater which coats a surface of the blanket with ink, a cliche, an idle roll which is provided at a lower end of the cliche, and a printing object, 2) allowing the printing roll to perform the rotational motion and coating the surface of the blanket with the ink, 3) transferring the ink to the cliche while synchronizing a movement speed of the cliche by the rotational motion of the printing roll having the blanket coated with the ink, and 4) printing the ink, which is not transferred to the cliche and exists on the blanket, onto the printing object.

According to the present application, the printing object may be a flat plate-shaped substrate or a film substrate. Because the flat plate-shaped substrate and the film substrate are the same as those described above, a detailed description thereof will be omitted.

According to the present application, 2) the coating of the surface of the blanket with the ink, and 3) the transferring of the ink to the cliche may be simultaneously performed.

In addition, 3) the transferring of the ink to the cliche, and 4) the printing of the ink onto the printing object may be simultaneously performed.

In addition, 2) the coating of the surface of the blanket with the ink, 3) the transferring of the ink to the cliche, and 4) the printing of the ink onto the printing object may be simultaneously performed.

Figure 7:
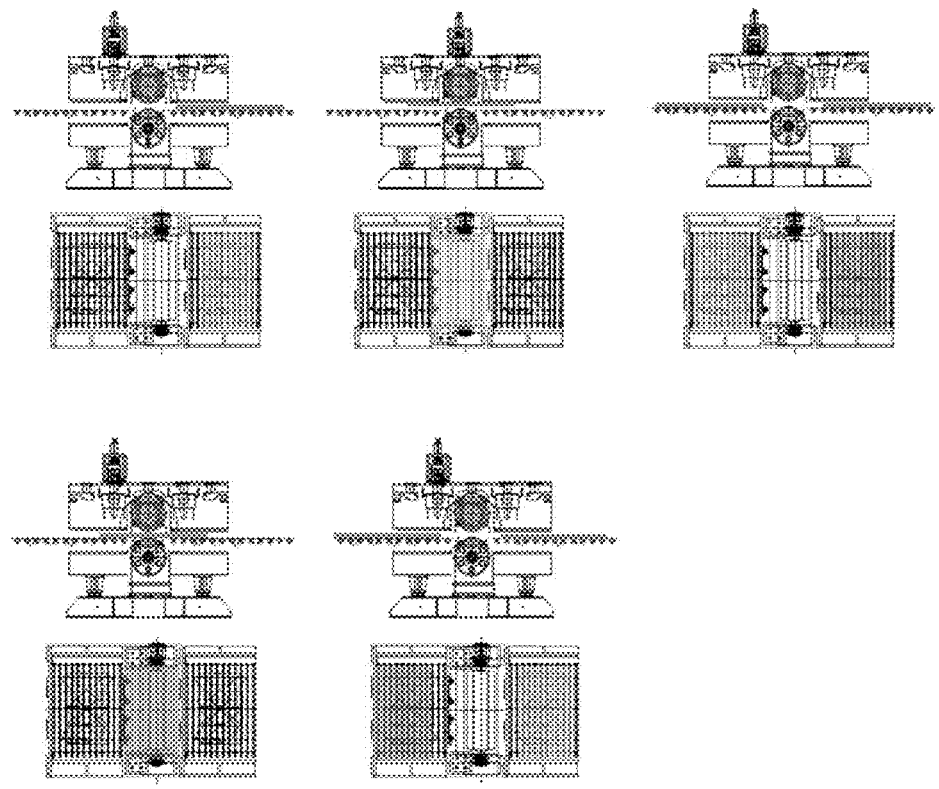
FIGS. 7 and 8 are views schematically illustrating a roll printing apparatus and a roll printing method according to an exemplary embodiment of the present application.

More specifically, the following FIG. 7 illustrates the roll printing apparatus and the roll printing method according to the exemplary embodiment of the present application. The following FIG. 7 illustrates the roll printing apparatus and the roll printing method in a case in which the printing object is a flat plate-shaped substrate.

As illustrated in FIG. 7, the cliche, which is loaded at the right side of the apparatus, passes between the printing roll and the idle roll that faces the printing roll, and in this case, the printing roll and the idle roll rotate to adjust a gap between the printing roll and the idle roll, thereby performing the off process using desired printing pressure. Thereafter, the off pattern is transferred to the printing object that is continuously loaded, the blanket of the printing roll is coated again with the ink before an additional cliche is loaded, and thereafter, the off process is performed by a newly loaded cliche.

In this case, the cliche and the printing object, which has passed between the printing roll and the idle roll, may be damaged while being lifted up, and in order to prevent damage, a roll, which is more tacky than the printing roll, may be used as the idle roll that is a lower roll, or a method of installing an auxiliary roller, which prevents the cliche and the printing object from being lifted up, at an edge of the cliche or the printing object may be used.

Figure 8:
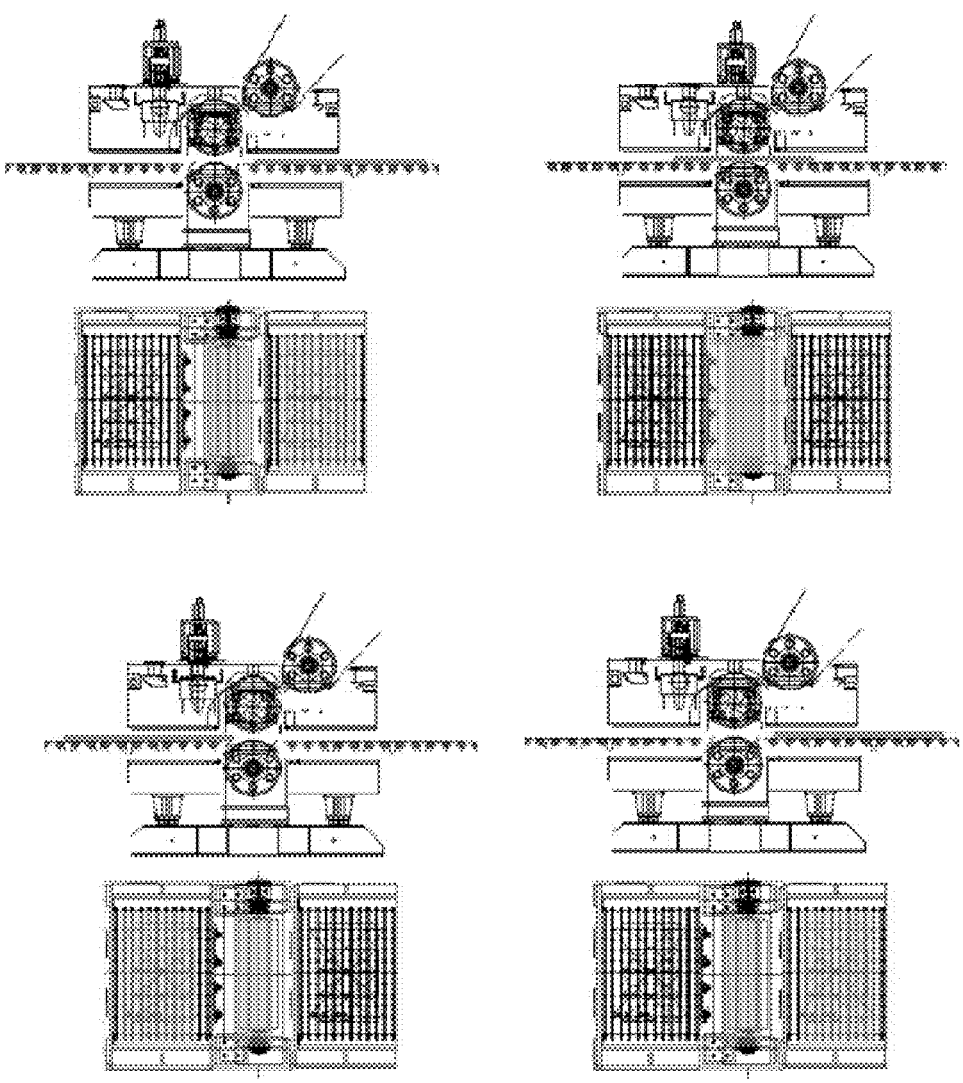

In addition, the following FIG. 8 illustrates the roll printing apparatus and the roll printing method according to the present application. The following FIG. 8 schematically illustrates the case in which the printing object is a film substrate.

In the following FIG. 8, the ink coating and off processes may be performed when the initially loaded cliche moves in a line from right side to the left side of the printing roll. Thereafter, the set process may be performed on the film substrate provided on the roll-shaped supporting unit.

When a higher process speed is desired, the off process and the set process may be simultaneously performed. This may be an advantage obtained by the features that a rotation direction of the printing roll according to the present invention need not be changed during a process condition, and the printing roll may rotate in a single direction.

In the roll printing apparatus according to the present invention, the idle roll may be formed in the form of a conveyor belt. In this case, a guide roll and the like may be additionally provided in order to prevent the cliche from being damaged and lifted up when the off and set processes are performed by the printing roll.

Figure 9:
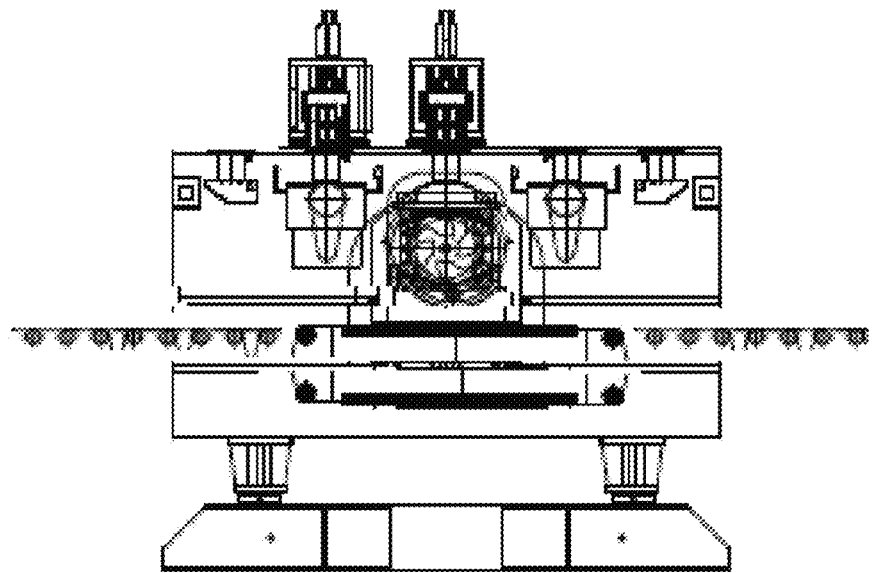
FIG. 9 is a view schematically illustrating a conveyor-type flat plate printing apparatus as the roll printing apparatus according to the exemplary embodiment of the present application.
Figure 10:
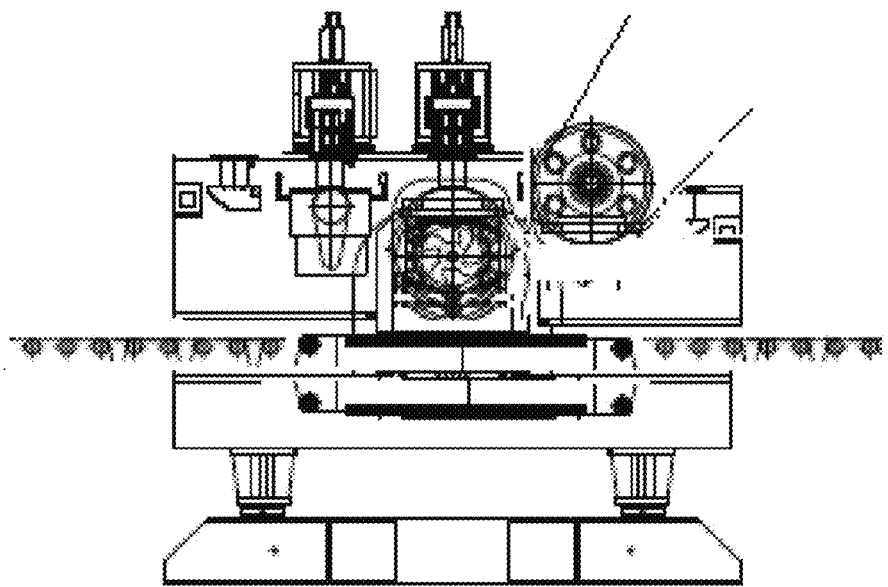
FIG. 10 is a view schematically illustrating a conveyor-type roll to roll printing apparatus as the roll printing apparatus according to the exemplary embodiment of the present application.

As the roll printing apparatus according to the exemplary embodiment of the present application, a conveyor-type flat plate printing apparatus is schematically illustrated in the following FIG. 9, and a conveyor-type roll to roll printing apparatus is schematically illustrated in FIG. 10.

Figure 11:
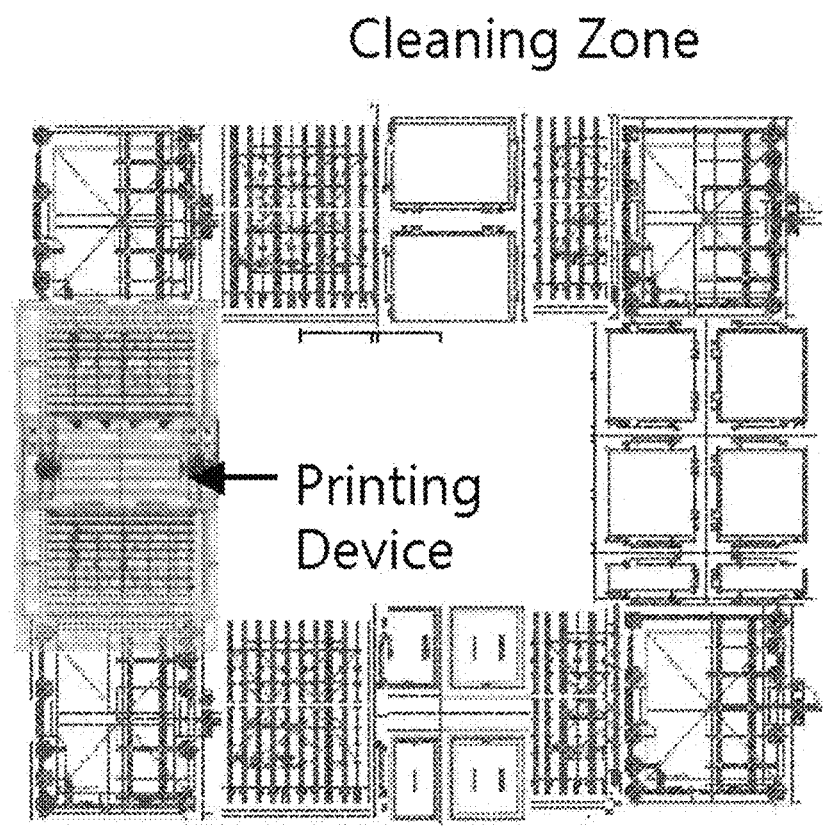
FIG. 11 is a view schematically illustrating an apparatus, which comprises a printing device and a cleaning device, as the roll printing apparatus according to the exemplary embodiment of the present application.

In addition, as the roll printing apparatus according to the exemplary embodiment of the present application, an apparatus comprising a printing device and a cleaning device is schematically illustrated in the following FIG. 11. As described above, in a case in which the apparatus according to the present application is configured together with the cleaning device, productivity may be more greatly improved, and in a case in which the apparatus is configured together with the device in a multi-storied type, a more excellent effect may be obtained.

According to the present application, the cliche may have a groove pattern, and a depth of at least a partial region of the groove pattern may be different from a depth of the remaining region. The cliche may control a bottom contact phenomenon that is a problem caused when a wide line width is implemented in the related art, and may have various line widths and etching depths.

In the cliche, the regions, which have different depths of the groove pattern, may comprise regions that have different line widths of the groove pattern. In order to prevent the bottom contact phenomenon of the cliche, it is preferable that the region having relatively larger line widths of the groove pattern comprises a region having greater depths in comparison with the region having relatively smaller line widths.

Figure 14:
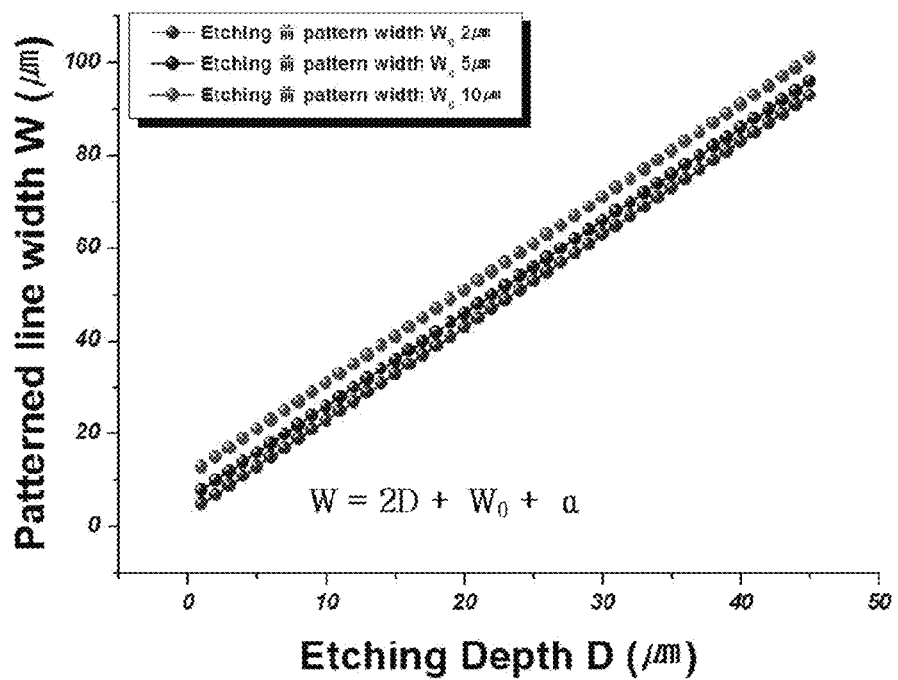
FIG. 14 is a view illustrating a relationship formula between an etching depth according to an initially patterned line width and a final etching line width at the time of a single etching process.

As illustrated in FIG. 14, in the case of a single etching, a minimum line width W may be determined by a relationship formula between a patterned line width WO and an etching depth D before etching, and only when the line width W corresponds to a printable region in a graph, the printing is possible without a bottom contact. Therefore, in the case of the single etching, printable line width and pitch are limited based on the etching depth. In order to overcome the limit, the present application introduces a dual etching process such that the cliche having various etching depths and line widths may be manufactured, and printed matters having various line widths and pitches may be formed using the cliche.

The groove pattern may simultaneously comprise at least two types of patterns having different line widths, and a difference in line width between the at least two types of patterns may be 15 µm or more. The at least two types of patterns, which have a line width difference of 15 µm or more, may be connected to each other. That is, the groove pattern may comprise a pattern in which the region having a minimum line width is connected to the region having a new line width formed by the dual etching process.

The groove pattern may comprise two or more types of patterns having a line width difference of 15 µm or more, and the groove pattern may additionally comprise a pattern having a line width that is different from the minimum line width by 500 µm or more.

An align key may be additionally comprised in a region of the cliche that does not have the groove pattern.

In addition, an exemplary embodiment of a method of manufacturing the cliche comprises 1) forming a first mask pattern on a substrate, 2) forming a second mask pattern on the substrate and the first mask pattern, 3) etching the substrate using the second mask pattern, 4) removing the second mask pattern, and 5) etching the substrate using the first mask pattern with an etching depth different from that of 3) the etching of the substrate using the second mask pattern.

In addition, another exemplary embodiment of a method of manufacturing the cliche comprises 1) forming a first mask pattern on a substrate, 2) forming a front layer for a second mask pattern on the substrate and the first mask pattern, 3) forming a third mask pattern on the front layer for the second mask pattern, 4) forming the second mask pattern using the third mask pattern, 5) etching the substrate using the second mask pattern, 6) removing the second mask pattern, and 7) etching the substrate using the first mask pattern with an etching depth different from that in 5) the etching of the substrate using the second mask pattern.

According to the method of manufacturing the cliche, as the substrate, a transparent glass substrate, a plastic film substrate, or the like may be used, but the substrate is not limited thereto.

According to the method of manufacturing the cliche, it is preferable that the first mask pattern and the second mask pattern comprise materials which have excellent adhesive force to the substrate, and with which the first mask pattern is not etched when the second mask pattern is formed.

More specifically, the first mask pattern may comprise one or more types of materials selected from a group comprising chromium, nickel, oxides thereof, and nitrides thereof, and the second mask pattern may comprise one or more types of materials selected from a group comprising molybdenum, and molybdenum oxide.

According to the method of manufacturing the cliche, as the etching process of the substrate, a method, which is known in the corresponding technical field, may be used, and more specifically, a wet etching process using an HF solution may be used, but the method is not limited thereto.

In order to resolve the problems suggested above, the present application manufactures the cliche using the dual etching process obtained by applying the method of manufacturing the cliche using the existing single etching process. To this end, the present application introduces a dual patterning process comprising an aligning process, and continuously performs an etching process of a deep region and an etching process of a shallow region at the time of the wet etching process.

Figure 20:
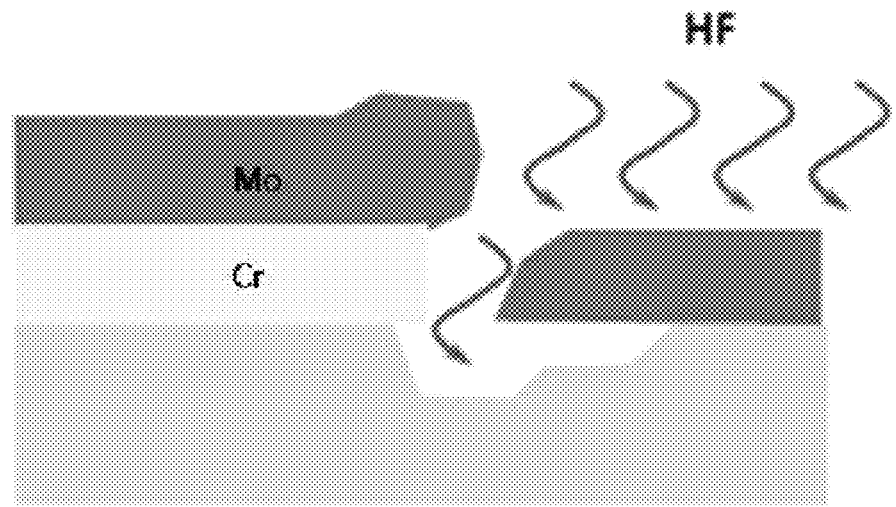
FIG. 20 is a view illustrating a relative difference in permeation of HF between a case in which only Cr exists, and a case in which CrOx exists.
Figure 20:
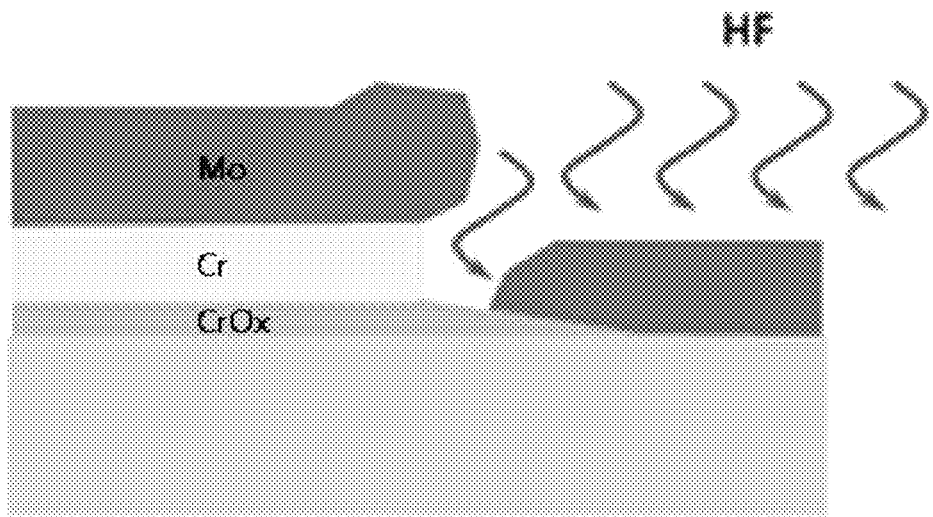

More specifically, the present application primarily performs patterning of the entire drawing region (comprising an align key for secondary exposure) on a CrOx/Cr deposited glass, performs patterning of CrOx/Cr (CrOx/Cr etching and PR separation are performed), and deposits Mo on the entire surface thereof again. In this case, the reason why the double layer of CrOx/Cr is used is that a tapered angle of Cr is high such that stack coverage of the material (Mo), which is subsequently deposited, is irregularly formed, and a hydrofluoric acid liquid may permeate a gap when a primary HF etching process is performed, and thus in order to prevent the permeation, it is advantageous to introduce CrOx which has a relatively low tapered angle in comparison with Cr, and has a low etching speed in comparison to Cr so as to form a tail. FIG. 20 is a view illustrating a relative difference in permeation of HF between a case in which only Cr exists, and a case in which CrOx exists.

After the CrOx/Cr patterning process, a process of opening (a method such as shadow masking) the align key region, which is primarily patterned, is performed. Thereafter, a photoresist is coated again on the glass on which Mo is secondarily deposited, a patterning process of Mo is performed with respect to the region having a different etching depth, and then the primary master cliche, which is manufactured by the aforementioned method, is loaded into a glass etching process. According to the glass etching process, the primary etching process basically performs an etching process through optimization of HF concentration and temperature for etching a deep etching depth. Thereafter, after removing the photoresist and Mo, a secondary etching process for implementing a shallow glass etching depth may be performed.

The reason why the process may be performed is that CrOx/Cr is not primarily etched by Mo etchant, and metal combinations having a selection ratio of the etching process may be readily applied to the present process.

Figure 15:
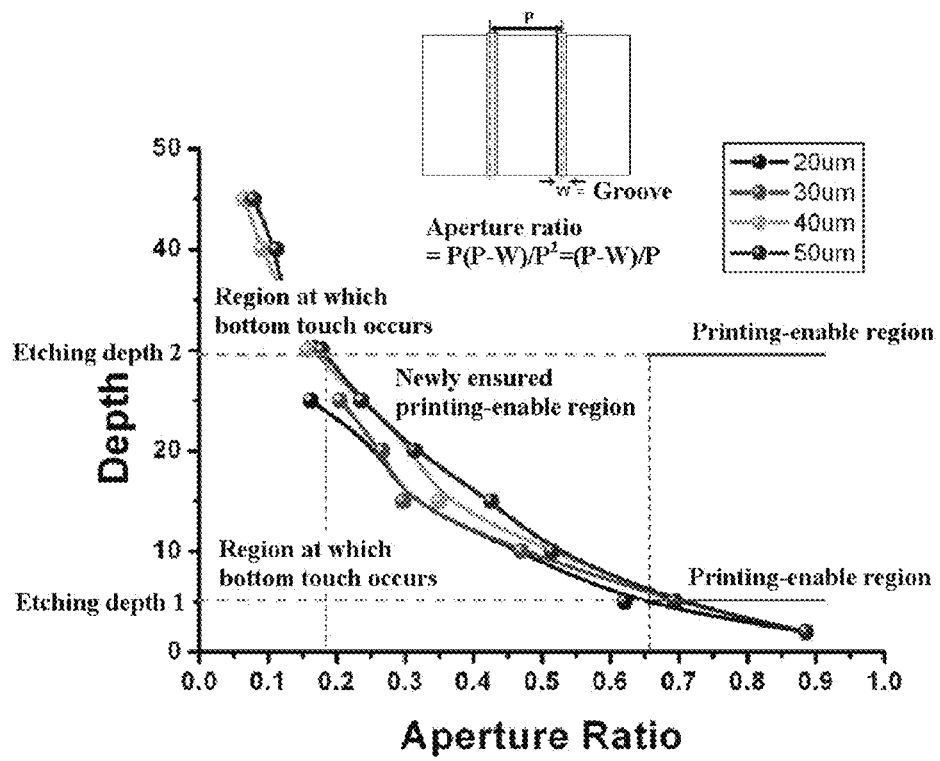
FIG. 15 is a view illustrating a result of a bottom contact of a linear pattern with respect to a printing direction of a cliche for offset-printing according to various etching depths at the time of a single etching process.

According to the present application, in order to secure a more accurate etching depth in comparison with the single etching process and the dual etching process of the cliche, a bottom contact region is confirmed using a method that will be described below. Primarily, in order to confirm a bottom contact phenomenon at the time of the single etching process with respect to a linear pattern that is arranged parallel to a printing direction, a mutual relationship between an aperture ratio (a groove is defined by a line width) having a line width and a pitch and the etching depth is confirmed for each printing pressure with respect to various etching depths. As a result, as illustrated in FIG. 15, it was confirmed that the bottom contact region does not greatly depend on the printing pressure, but greatly varies depending on the aperture ratio. In this case, in a case in which in the variation graph, the aperture ratio is defined using the line width and the pitch, the printable region may be expressed by the following Relationship Formula 1.

$$D \geq 42.9\exp(-\{(P-W)/P\}/0.35)-1.5 \quad \text{[Relationship Formula 1]}$$

In Relationship Formula 1, D refers to an etching depth, P refers to a pitch, W refers to a pattern line width, and all units are micrometer.

Figure 16:
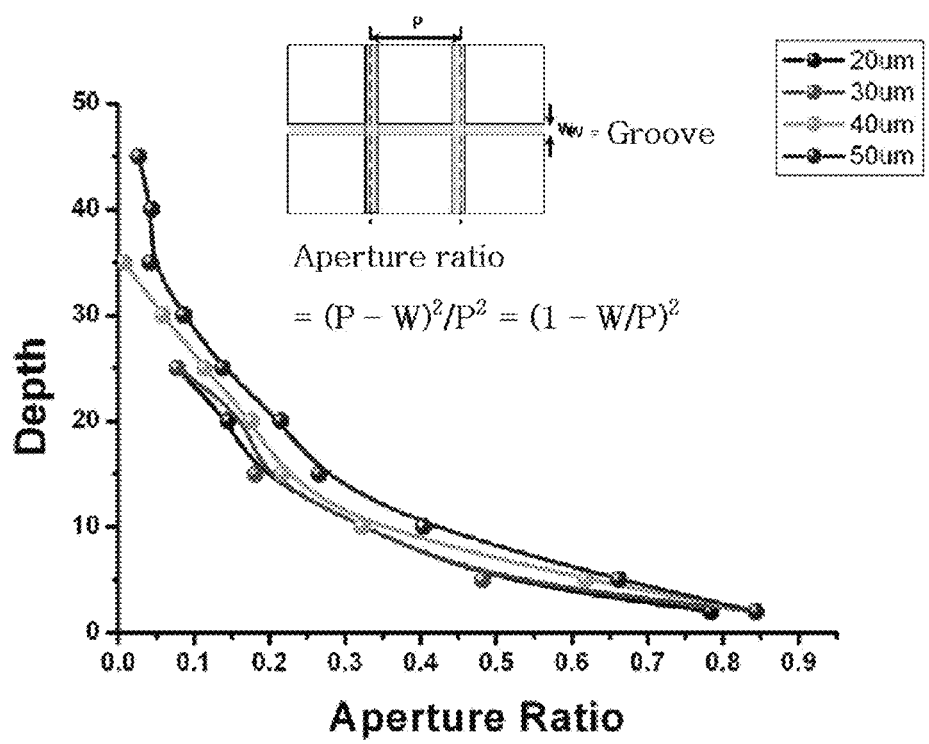
FIG. 16 is a view illustrating a result of a bottom contact with respect to a square pattern of the cliche for offset-printing according to various etching depths at the time of a single etching process.

In addition, in the present invention, the same test was also performed against a closed figure such as a mesh and a square pattern which is not the aforementioned two-dimensional linear pattern. As a result, a graph as illustrated in FIG. 16 could be obtained, and in a case in which in the variation graph, the aperture ratio is defined using the line width and the pitch, the printable region may be expressed by the following Relationship Formula 2.

$$D \geq 33.8\exp(-\{(P-W)/P\}/0.235)+0.82 \quad \text{[Relationship Formula 2]}$$

In Relationship Formula 2, D refers to an etching depth, P refers to a pitch, W refers to a pattern line width, and all units are micrometer.

Figure 17:
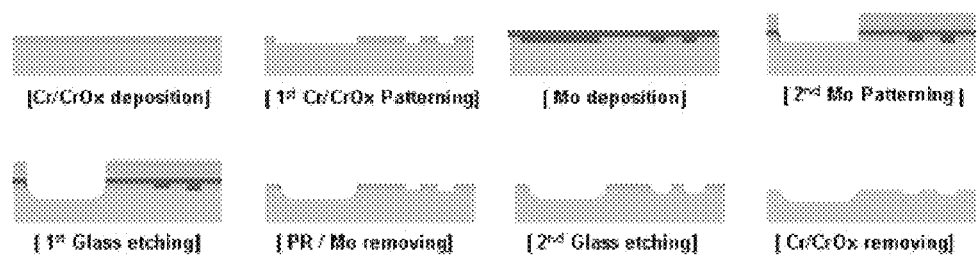
FIG. 17 is a view schematically illustrating a process of manufacturing the cliche for offset-printing according to the exemplary embodiment of the present application.

Therefore, in a case in which patterning is required for a region that does not satisfy the relationship formulas with a predetermined etching depth, a method of additionally securing the printable region by redefining an etching depth D corresponding to the region was recognized as the efficient method, and in order to form the etching depth, a dual etching cliche was manufactured using a method as illustrated in FIG. 17, and in this case, it was confirmed that a new printable region indicated by dotted lines of FIG. 15 may be secured.

Figure 18:
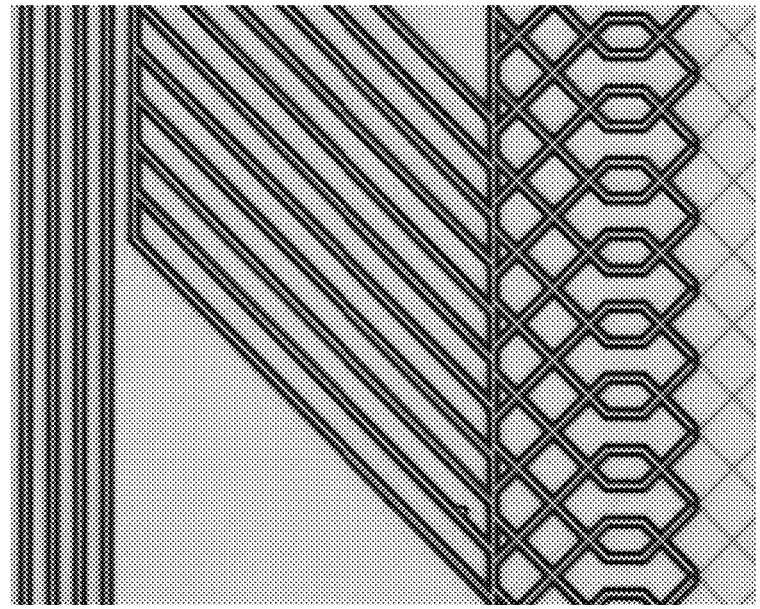
FIG. 18 is a view illustrating micrographs of the cliche for offset-printing according to the exemplary embodiment of the present application, and a printed matter printed using the cliche.
Figure 18:
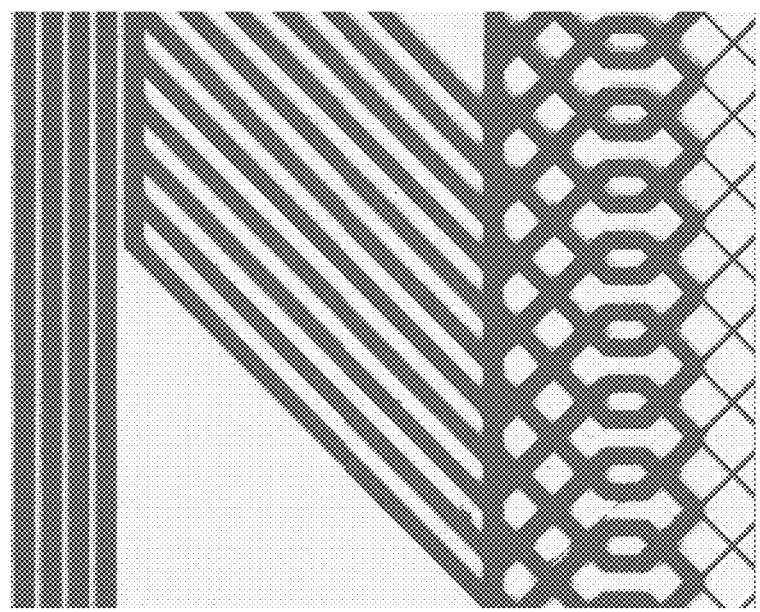
Figure 19:
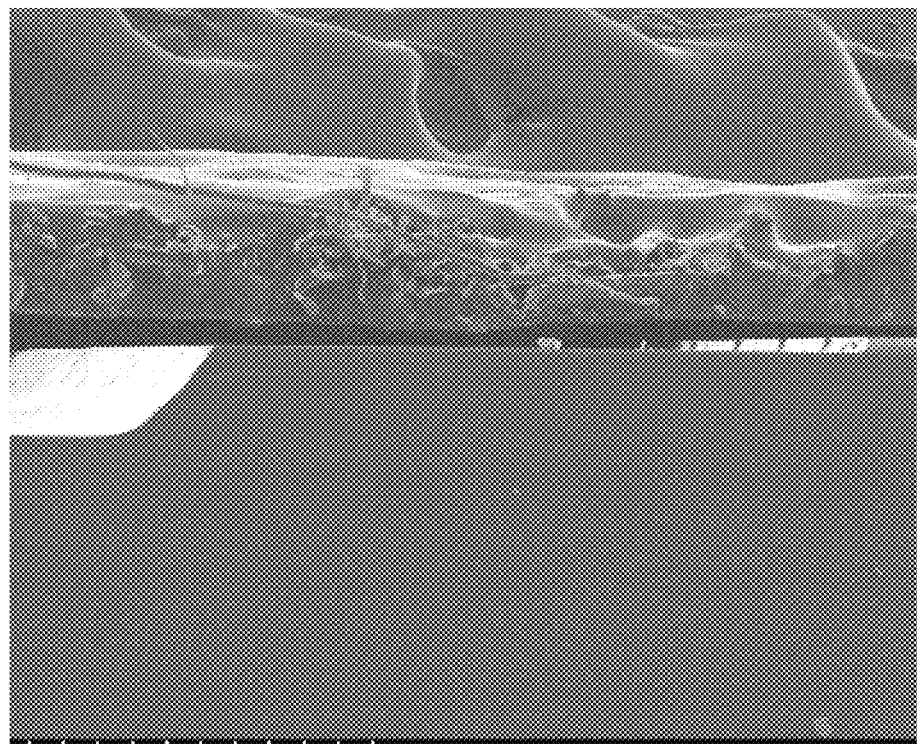
FIG. 19 is a view illustrating an electron micrograph of a cross section of the cliche for offset-printing according to the exemplary embodiment of the present application.

FIG. 18 illustrates micrographs of the cliche for offset-printing according to the exemplary embodiment of the present invention and a printed matter printed using the cliche, and FIG. 19 illustrates an SEM image of a cross section of the cliche for offset-printing according to the exemplary embodiment of the present invention.

As described above, the present application comprises the dual etching process when the cliche is manufactured so as to control a bottom contact phenomenon that is a problem of the related art caused when a wide line width is implemented, and may manufacture the cliche for offset-printing having various line widths and etching depths.

In addition, the present invention provides a printed matter printed using the roll printing apparatus.

The printed matter may comprise at least two types of patterns having different line widths, and a difference in line width between the at least two types of patterns may be 15 or more.

In addition, the present invention provides a touch panel comprising the printed matter.

The touch panel may be manufactured using the material, the manufacturing method, and the like, which are known in the corresponding technical field, except that the touch panel comprises the printed matter printed using the roll printing apparatus and the roll printing method according to the present invention.

According to the present application, the cliche may be conveyed by the rotational motion of the printing roll, and the movement speed of the cliche may be synchronized by the rotational motion of the printing roll. Therefore, the roll printing apparatus and the roll printing method according to the present application may continuously perform roll printing, and may reduce a tack time, thereby greatly improving productivity. In addition, the printing object on which printing is completed and the printing object to be subsequently printed may be efficiently replaced, thereby improving productivity.

The invention claimed is:

1. A roll printing apparatus comprising:
   a printing roll support, a printing roll, a blanket which is provided on an outer surface of the printing roll, a coater which coats a surface of the blanket with ink, a cliche, and a printing object,
   wherein the printing roll is provided to be fixed to the printing roll support so as to perform rotational motion, and the cliche is conveyed by the rotational motion of the printing roll.

2. The roll printing apparatus of claim 1, wherein a movement speed of the cliche is synchronized by the rotational motion of the printing roll.

3. The roll printing apparatus of claim 1, further comprising:
   an idle roll,
   wherein the idle roll is provided at a lower end of the cliche.

4. The roll printing apparatus of claim 3, wherein the printing object is a flat plate-shaped substrate, and the flat plate-shaped substrate is provided on the idle roll.

5. The roll printing apparatus of claim 1, further comprising:
   a roll-shaped supporting unit which supports the printing object,
   wherein the printing object is a film substrate.

6. The roll printing apparatus of claim 5, further comprising:
   a printing object providing unit which continuously provides the film substrate, and a printing object collecting unit which continuously collects the film substrate.

7. The roll printing apparatus of claim 6, wherein the roll-shaped supporting unit is provided between the printing object providing unit and the printing object collecting unit.

8. The roll printing apparatus of claim 5, wherein the roll-shaped supporting unit comprises a stationary roll, a freely rotating roll which is provided on an outer surface of the stationary roll, and a porous sheet which is provided on an outer surface of the freely rotating roll.

9. The roll printing apparatus of claim 8, wherein vacuum holes are provided in the entire region of the freely rotating roll.

10. The roll printing apparatus of claim 8, wherein vacuum holes is provided in a region of the stationary roll which corresponds to a region with which the film substrate and the printing roll come into contact.

11. The roll printing apparatus of claim 1, wherein the roll printing apparatus is for reverse offset printing.

12. A roll printing method using the roll printing apparatus of claim 1.

13. A roll printing method comprising:
   1) preparing a printing roll which is provided to be fixed to a printing roll support so as to perform rotational motion, a blanket which is provided on an outer surface of the printing roll, a coater which coats a surface of the blanket with ink, a cliche, an idle roll which is provided at a lower end of the cliche, and a printing object;
   2) allowing the printing roll to perform the rotational motion and coating the surface of the blanket with the ink;
   3) transferring the ink to the cliche while synchronizing a movement speed of the cliche by the rotational motion of the printing roll having the blanket coated with the ink; and 4) printing the ink, which is not transferred to the cliche and exists on the blanket, onto the printing object.

14. The roll printing method of claim 13, wherein the printing object is a flat plate-shaped substrate or a film substrate.

15. The roll printing method of claim 13, wherein 2) the coating of the surface of the blanket with the ink, and 3) the transferring of the ink to the cliche are simultaneously performed.

16. The roll printing method of claim 13, wherein 3) the transferring of the ink to the cliche, and 4) the printing of the ink onto the printing object are simultaneously performed.

17. The roll printing method of claim 13, wherein 2) the coating of the surface of the blanket with the ink, 3) the transferring of the ink to the cliche, and 4) the printing of the ink onto the printing object are simultaneously performed.

18. A printed matter printed using the roll printing apparatus of claim 1.

19. The printed matter of claim 18, wherein the printed matter comprises at least two types of patterns having different line widths, and a difference in line width between the at least two types of patterns is 15 μm or more.

20. A touch panel comprising the printed matter of claim 18.

* * * * *